United States Patent
Dosho et al.

(10) Patent No.: US 7,459,964 B2
(45) Date of Patent: Dec. 2, 2008

(54) SWITCHED CAPACITOR FILTER AND FEEDBACK SYSTEM

(75) Inventors: Shiro Dosho, Osaka (JP); Yusuke Tokunaga, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 10/594,398

(22) PCT Filed: Nov. 17, 2004

(86) PCT No.: PCT/JP2004/017064

§ 371 (c)(1),
(2), (4) Date: Sep. 26, 2006

(87) PCT Pub. No.: WO2005/093952

PCT Pub. Date: Oct. 6, 2005

(65) Prior Publication Data

US 2007/0205825 A1  Sep. 6, 2007

(30) Foreign Application Priority Data

Mar. 26, 2004  (JP)  ............................... 2004-093254

(51) Int. Cl.
*H03K 5/00* (2006.01)
*H03L 7/06* (2006.01)

(52) U.S. Cl. ........................ 327/554; 327/558; 327/157; 327/148; 327/156

(58) Field of Classification Search ......... 327/156–158, 327/147–149, 554, 558
See application file for complete search history.

(56) References Cited

U.S. PATENT DOCUMENTS

| 4,344,050 A | * | 8/1982 | Callahan | ...................... 333/173 |
| 4,378,538 A | * | 3/1983 | Gignoux | ...................... 333/173 |
| 4,755,779 A | * | 7/1988 | Gignoux | ...................... 333/173 |
| 5,055,803 A | | 10/1991 | Hietala | |
| 6,130,948 A | | 10/2000 | Hirano et al. | |

(Continued)

FOREIGN PATENT DOCUMENTS

JP  57-43630  3/1982

(Continued)

OTHER PUBLICATIONS

Chinese Office Action issued in Patent Application No. 2004800425701 dated on Aug. 1, 2008.

(Continued)

*Primary Examiner*—Dinh T. Le
(74) *Attorney, Agent, or Firm*—McDermott Will & Emery LLP

(57) ABSTRACT

A loop filter (30) includes a first capacitor (31) provided between an input terminal for a current signal and a reference voltage, a switched capacitor circuit (32) provided between the input terminal and the first capacitor (31) and a second capacitor (33) provided in parallel to the first capacitor (31) and the switched capacitor circuit (32). In the switched capacitor circuit (32), when a third capacitor (321) is connected to the first capacitor (31), a fourth capacitor (322) is connected to the second capacitor (33). In the loop filter (30) having the above-described configuration, a capacitance value of the second capacitor (33) is set to be larger than respective capacitance values of the third and fourth capacitors (321 and 322).

5 Claims, 16 Drawing Sheets

U.S. PATENT DOCUMENTS

| | | |
|---|---|---|
| 6,420,917 B1 | 7/2002 | Klemmer |
| 6,995,607 B2 * | 2/2006 | Dosho et al. ............... 327/558 |
| 7,016,450 B2 * | 3/2006 | Lin et al. .................. 375/374 |
| 2003/0057928 A1 | 3/2003 | Lin et al. |

FOREIGN PATENT DOCUMENTS

| | | |
|---|---|---|
| JP | 57-84614 | 5/1982 |
| JP | 03-163912 | 7/1991 |
| JP | 5-505085 | 7/1993 |
| JP | 10-108299 | 4/1998 |
| JP | 2003-517755 | 5/2003 |
| WO | WO 92/10879 | 6/1992 |
| WO | WO 01/26230 A1 | 4/2001 |

OTHER PUBLICATIONS

US 6,259,289, 07/2001, Klemmer (withdrawn)

* cited by examiner

SWITCHED CAPACITOR FILTER AND FEEDBACK SYSTEM

RELATED APPLICATION

This application is a national phase of PCT/JP2004/017064 filed on Nov. 17, 2004, which claims priority from Japanese Application No. 2004-093254 filed on Mar. 26, 2004, the disclosures of which Applications are incorporated by reference herein. The benefit of the filing and priority dates of the International and Japanese Applications is respectfully requested.

TECHNICAL FIELD

The present invention relates to switched capacitor filters, and more particularly relates to technique for a switched capacitor filter suitable for a loop filter in a feedback system such as a phase-locked loop and a delay locked loop.

BACKGROUND ART

Today, the number of functions provided in a system LSI has been increased and the circuit size of system LSIs tends to be increased. Thus, reduction in the circuit size of system LSIs has been a universal issue.

In almost all LSIs, a phase-locked loop (which will be hereafter referred to as a "PLL") is provided. As for PLLs, there is the restriction that a maximum value of a response time can not be made to be equal to or larger than about one-tenth of a frequency of an input clock. Therefore, a CR product of a loop filter constituting a PLL has to be set to be relatively large. To achieve a relatively large CR product, in general, a capacitance value of a capacitor constituting a loop filter is set to be large. Accordingly, among components of the PLL, the loop filter occupies a larger portion of a circuit area of the PLL. Since the lower a frequency of an input clock in the PLL is, the larger a response time becomes, the capacitance value of the capacitor constituting the loop filter has to be set even larger. As a result, the circuit size of the PLL is increased. To solve such problems, reduction in the circuit size of loop filters is desired.

As a technique for reducing the circuit size of a loop filter used in a PLL, there is a technique disclosed in Japanese Patent Application No. 2003-185573 by the first inventor of the present application et al. FIG. 16 is a block diagram illustrating a configuration of a loop filter according to the invention (which will be hereafter referred to as "prior application") disclosed in the specification of Japanese Patent Application No. 2003-185573. The loop filter includes a capacitor 310 (capacitance value C) connected to an input terminal IN1, a resistor 320 (resistance value R) and a capacitor 330 (capacitance value $C_3$) which are connected to an input terminal IN2, and a voltage buffer circuit 350 provided between the capacitor 310 and the resistor 320. Discharge/charge currents (charge currents) Ip1 and Ip2 are supplied to the input terminals IN1 and IN2, respectively, from a dual charge pump circuit. Then, the loop filter outputs a voltage Vout generated at a connection point of the resistor 320 and the capacitor 330. In the loop filter, with a current supplied to the capacitor 310 set to be smaller than a current supplied to the resistor 320, only a capacitance value of the capacitor 310 is reduced without increasing a resistance value of the resistor 320. Thus, the same CR product as that of a known loop filter, i.e., the same filter characteristics as those of the known loop filter can be realized. Moreover, because a sufficient voltage is applied to each of the capacitors 310 and 330, it is possible to realize use of a MOS capacitor as each of the capacitors. Thus, respective sizes of the capacitors 310 and 330 are reduced, so that the entire circuit size of the loop filter is reduced.

The loop filter has to be configured so that a sufficiently large voltage is generated in the resistor 320. Therefore, a current value of a current flowing in the resistor 320 has to be set to be relatively large or a resistance value of the resistor 320 has to be set to be relatively large. However, each of those cases is not preferable because power consumption of the resistor 320 becomes relatively large in either case. Specifically, since the resistor 320 becomes a cause of the generation of noise, it is preferable to avoid increasing the resistance value of the resistor 320.

To reduce noise caused due to a resistor in a loop filter, a loop filter including, instead of a resistor, a switched capacitor circuit has been well known (see, for example, Patent Reference 1). FIG. 17 is a block diagram illustrating a configuration of a known loop filter including a switched capacitor circuit. The loop filter includes capacitors 310 (capacitance value C) and 330 (capacitance value $C_3$) connected to an input terminal IN and a switched capacitor circuit 320A connected to the capacitor 310. The loop filter outputs a voltage Vout generated at a connection point of the capacitors 310 and 330. The switched capacitor circuit 320A includes a capacitor 340 (capacitance value $C_R$) and switches Q1 and Q2 for switching a connection direction of the capacitor 340. The switched capacitor circuit 320A substantially exhibits a resistance value R. In the above-described configuration, a resistor is omitted from a loop filter, so that noise caused due to the resistor can be reduced.

Patent Reference 1: U.S. Pat. No. 6,420,917, specification, (pp. 6-7, FIG. 4).

DISCLOSURE OF INVENTION

Problems that the Invention is to Solve

As has been described, the loop filter according to the prior application has a problem in which power consumption is relatively large while a circuit size is reduced. Moreover, to realize the capacitor 310 using a MOS capacitor, the voltage buffer circuit 350 has to be provided, but the voltage buffer circuit 350 causes the generation of noise. For those reasons, it is preferable to omit the voltage buffer circuit 350.

On the other hand, considering a known loop filter including a switched capacitor circuit, the known loop filter does not include a resistor and a voltage buffer circuit. Thus, noise caused by those components is not a problem. However, the capacitor 310 is still relatively large as in a known technique, and reduction in the circuit size is difficult. Moreover, when the switch Q1 is turned ON, the capacitor 340 is connected with the capacitor 310 in series and it is difficult to apply a sufficient voltage to the capacitor 340. Therefore, it is difficult to realize the capacitor 340 using a MOS capacitor. This is because a larger voltage than a threshold of a MOS transistor constituting a MOS capacitor has to be applied to the MOS transistor.

In view of the above-described problems, it is an object of the present invention to reduce a circuit size of a switched capacitor filter including a switched capacitor circuit. Particularly, it is another object of the present invention to provide a switched capacitor filer in which, instead of providing a voltage buffer circuit, each capacitor is formed of a MOS capacitor.

Solution to the Problems

As means for achieving the above-described objects according to the present invention, a switched capacitor filter for receiving a current signal and outputting a voltage signal has been devised. The inventive switched capacitor filter includes a first capacitor provided between an input terminal for the current signal and a reference voltage; a switched capacitor circuit provided between the input terminal and the first capacitor; and a second capacitor provided in parallel to the first capacitor and the switched capacitor circuit.

Thus, the switched capacitor circuit functions as a resistor, so that the switched capacitor filter is operated as a passive-type secondary low-pass filter. Normally, the switched capacitor circuit is formed of one or more capacitors. Accordingly, the switched capacitor filter includes only capacitors. The switched capacitor circuit is provided between the input terminal and the first capacitor. Thus, when a capacitor in the switched capacitor circuit is connected to an input terminal side, a sufficiently large voltage is applied to the capacitor. Therefore, a capacitance of the capacitor can be reduced. As a result, a circuit size of the entire switched capacitor filter can be reduced.

Specifically, the switched capacitor circuit includes first and second terminals, third and fourth capacitors each having one end to which a reference voltage is supplied and substantially the same capacitance, and a switching section for switching a connection state between the other end of each of the third and fourth capacitors and an associated one of the first and second terminals. When the switching section connects the other end of the third capacitor to the first terminal, the switching section connects the other end of the fourth capacitor to the second terminal, and when the switching section connects the other end of the third capacitor to the second terminal, the other end of the fourth capacitor to the first terminal. The capacitance of the second capacitor is larger than respective capacitances of the third and fourth capacitors.

In the above-described manner, with the capacitance of the second capacitor set to be larger than the respective capacitances of the third and fourth capacitors in the switched capacitance circuit, the switched capacitor filter has the same filter characteristics as those of a typical passive-type secondary low-pass filter.

Each of the first through fourth capacitors is preferably a MOS capacitor.

Specifically, the switched capacitor circuit includes a first terminal provided on a side of the first capacitor, a second terminal provided on a side of the input terminal, a plurality of capacitors each having one end to which a reference voltage is supplied and substantially the same capacitance, and a switching section for switching a connection state between the other end of each of the plurality of capacitors and an associated one of the first and second terminals. While maintaining connection between the other end of one of the plurality of capacitors and the second terminal, when the switching section connects the other end of one of other two of the plurality of capacitors to the first terminal, the switching section connects the other end of the other one of the other two to the second terminal.

Each of the first and second capacitors and the plurality of capacitors is preferably a MOS capacitor.

As another means according to the present invention, a feedback system for feeding back an output clock generated on the basis of an input clock to make the output clock have a predetermined characteristic has been devised. The feedback system includes: a charge pump circuit for generating a charge current, on the basis of a phase difference between the input clock and a fed-back clock; a loop filter for receiving the charge current as an input; and an output clock generator circuit for generating the output clock, on the basis of an output signal from the loop filter. The loop filter includes a first capacitor provided between an input terminal for the charge current and a reference voltage, a switched capacitor circuit provided between the input terminal and the first capacitor, and a second capacitor provided in parallel to the first capacitor and the switched capacitor circuit.

Thus, the switched capacitor circuit functions as a resistor, so that the loop filter is operated as a passive-type secondary low-pass filter. Normally, the switched capacitor circuit is formed of one or more capacitors. Accordingly, the loop filter includes only capacitors. The switched capacitor circuit is provided between the input terminal and the first capacitor. Thus, when a capacitor in the switched capacitor circuit is connected to an input terminal side, a sufficiently large voltage is applied to the capacitor. Therefore, a capacitance of the capacitor can be reduced. As a result, a circuit size of the entire loop filter and, furthermore, a circuit size of the entire feedback system can be reduced.

Specifically, the switched capacitor circuit includes first and second terminals, third and fourth capacitors each having one end to which a reference voltage is supplied and substantially the same capacitance, and a switching section for switching a connection state between the other end of each of the third and fourth capacitors and an associated one of the first and second terminals. When the switching section connects the other end of the third capacitor to the first terminal, the switching section connects the other end of the fourth capacitor to the second terminal, and when the switching section connects the other end of the third capacitor to the second terminal, the other end of the fourth capacitor to the first terminal, and the capacitance of the second capacitor is larger than respective capacitances of the third and fourth capacitors.

Specifically, the feedback system further includes a control clock generator circuit for generating, on the basis of a falling of the input clock, first and second control clocks having an inverse correlation with each other and third and fourth control clocks corresponding to inverse clocks of the first and second control clocks, respectively. The switching section includes a switch for switching a connection state between the other end of the third capacitor and the first terminal according to the first control clock, a switch for switching a connection state between the other end of the fourth capacitor and the first terminal according to the second control clock, a switch for switching a connection state between the other end of the third capacitor and the second terminal according to the third control clock, and a switch for switching a connection state between the other end of the fourth capacitor and the second terminal.

In this manner, with the capacitance of the second capacitor set to be larger than respective capacitances of the third and fourth capacitors in the switched capacitance circuit, the loop filter has the same filter characteristics as those of a typical passive-type secondary low-pass filter.

Each of the first through fourth capacitors is preferably a MOS capacitor.

Specifically, in the feedback system, the switched capacitor circuit includes a first terminal provided on a side of the first capacitor, a second terminal provided on a side of the input terminal, a plurality of capacitors each having one end to which a reference voltage is supplied and substantially the same capacitance, and a switching section for switching a connection state between the other end of each of the plurality of capacitors and an associated one of the first and second terminals. While maintaining connection between the other end of one of the plurality of capacitors and the second terminal, when the switching section connects the other end of one of other two of the plurality of capacitors to the first terminal, the switching section connects the other end of the other one of the two to the second terminal.

Specifically, the feedback system further includes a control clock generator circuit for generating, on the basis of a falling of the input clock, a plurality of control clocks having different phases from each other and the number of the plurality of control clocks corresponds to the number of the plurality of capacitors and a plurality of inversion control clocks corresponding to inversed clocks of the plurality of control clocks. The switching section includes a plurality of switches, provided so as to correspond to the plurality of capacitors, respectively, each switching a connection state between the other end of an associated one of the plurality of capacitors and the first terminal according to one of the plurality of control clocks corresponding to the associated one of the plurality of capacitors, and a plurality of switches, provided so as to correspond to the plurality of capacitors, respectively, each switching a connection state between the other end of an associated one of the plurality of capacitors and the second terminal according to one of the plurality of control clocks corresponding to the associated one of the plurality of capacitors.

Each of the first and second capacitors and the plurality of capacitors is preferably a MOS capacitor.

Effects of the Invention

As has been described, according to the present invention, a switched capacitor filter which has the same filter characteristics as those of a known technique and a reduced circuit size can be obtained. The switched capacitor filter does not include a resistor and a voltage buffer circuit but includes only capacitors. Thus, with a reduced input current, a size of each of the capacitors is reduced and a circuit size as a whole can be reduced. Furthermore, when the switched capacitor is used as a loop filter of a feedback system, a size of a charge pump circuit can be reduced by reducing a charge current which is an input current of the loop filter. As a result, a circuit size of an entire feedback system can be largely reduced.

EXPLANATION OF REFERENCE NUMERALS

31 MOS capacitor (first capacitor)
32, 32A Switched capacitor circuit
33 MOS capacitor (second capacitor)
321 MOS capacitor (third capacitor, one of a plurality of capacitors)
322 MOS capacitor (fourth capacitor, one of the plurality of capacitors)
323 MOS capacitor (one of the plurality of capacitors).
324, 324A Switching section
20 Charge pump circuit
30, 30A Loop filter
40 Voltage control oscillator (output clock generator circuit)
60, 60', 60A Control clock generator circuit
T1 Terminal (first terminal)
T2 Terminal (second terminal)
SW11, SW12, SW21, SW22, SW31, SW32 Switch
φ1 Control clock (first control clock, one of a plurality of control clocks)
φ2 Control clock (second control clock, one of the plurality of control-clocks)
φ3 Control clock (one of the plurality of control clocks)
/φ1 Control clock (third control clock, one of a plurality of inversion control clocks)
/φ2 Control clock (fourth control clock, one of the plurality of inversion control clocks)
/φ3 Control clock (one of the plurality of inversion control clocks)
CKin Input clock
CKout Output clock

BEST MODE FOR CARRYING OUT THE INVENTION

Hereafter, best mode for carrying out the present invention will be described with reference to the accompanying drawings.

First Embodiment

Figure 1:
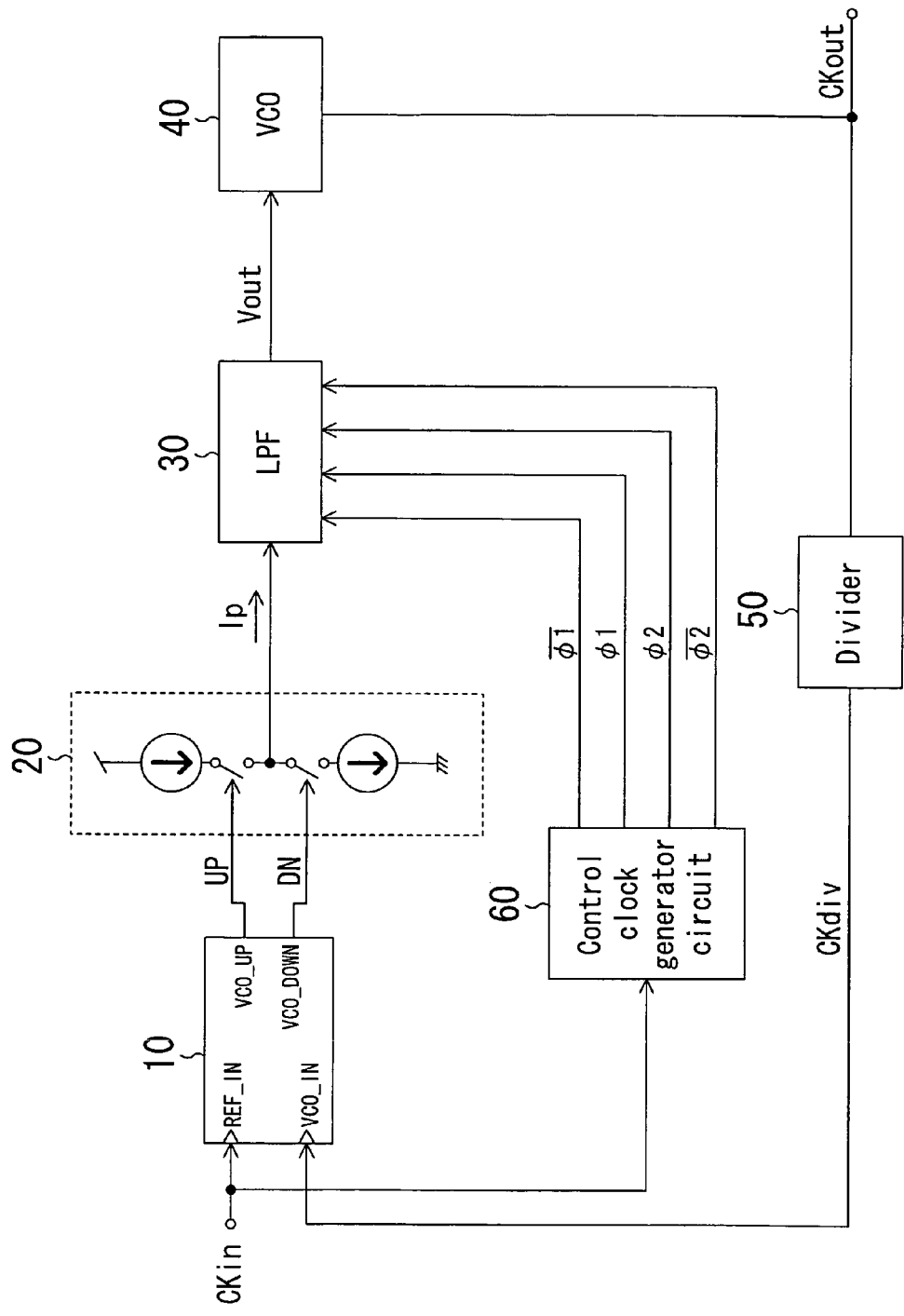
FIG. 1 is a block diagram illustrating a configuration of a phase-locked loop according to a first embodiment of the present invention.

FIG. 1 illustrates a configuration of a PLL according to a first embodiment of the present invention. The PLL of this embodiment includes a phase comparator 10, a charge pump circuit 20, a loop filter (LPF) 30, a voltage control oscillator (VCO) 40 as an output clock generator circuit, a frequency divider 50 and a control clock generator circuit 60. The phase comparator 10 compares a phase of an input clock CKin supplied to the PLL with a phase of a feedback clock CKdiv and outputs an up signal UP and a down signal DN according to a difference between the phases. The charge pump circuit 20 outputs (discharges or charges), on the basis of the up signal UP and the down signal DN, a charge current Ip. The voltage control oscillator 40 changes, on the basis of the voltage Vout output from the loop filter 30, a frequency of the output clock CKout of the PLL. The frequency divider 50 frequency-divides the output clock CKout by N (N is a natural number) and feeds back the frequency-divided output clock as the feedback clock CKdiv to the phase comparator 10. While the above-described operations are repeated, the output clock CKout gradually converges to a predetermined frequency and is locked. Hereafter, configurations and operations of the loop filter 30 and the control clock generator circuit 60 will be described in detail.

Figure 2:
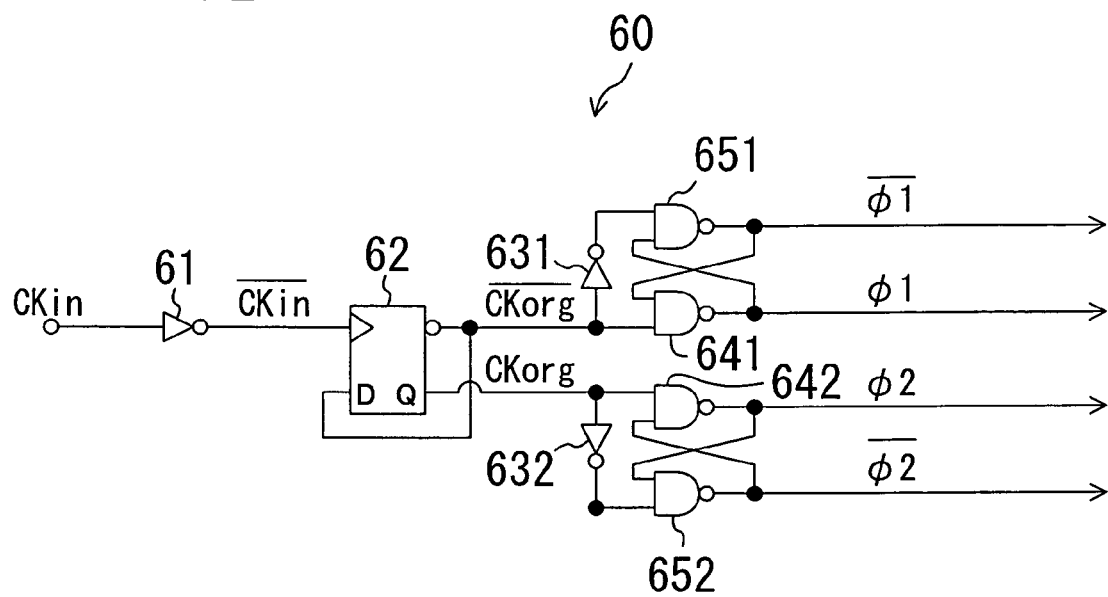
FIG. 2 is a block diagram illustrating a configuration of a control clock generator circuit in the phase-locked loop of FIG. 1.
Figure 3:
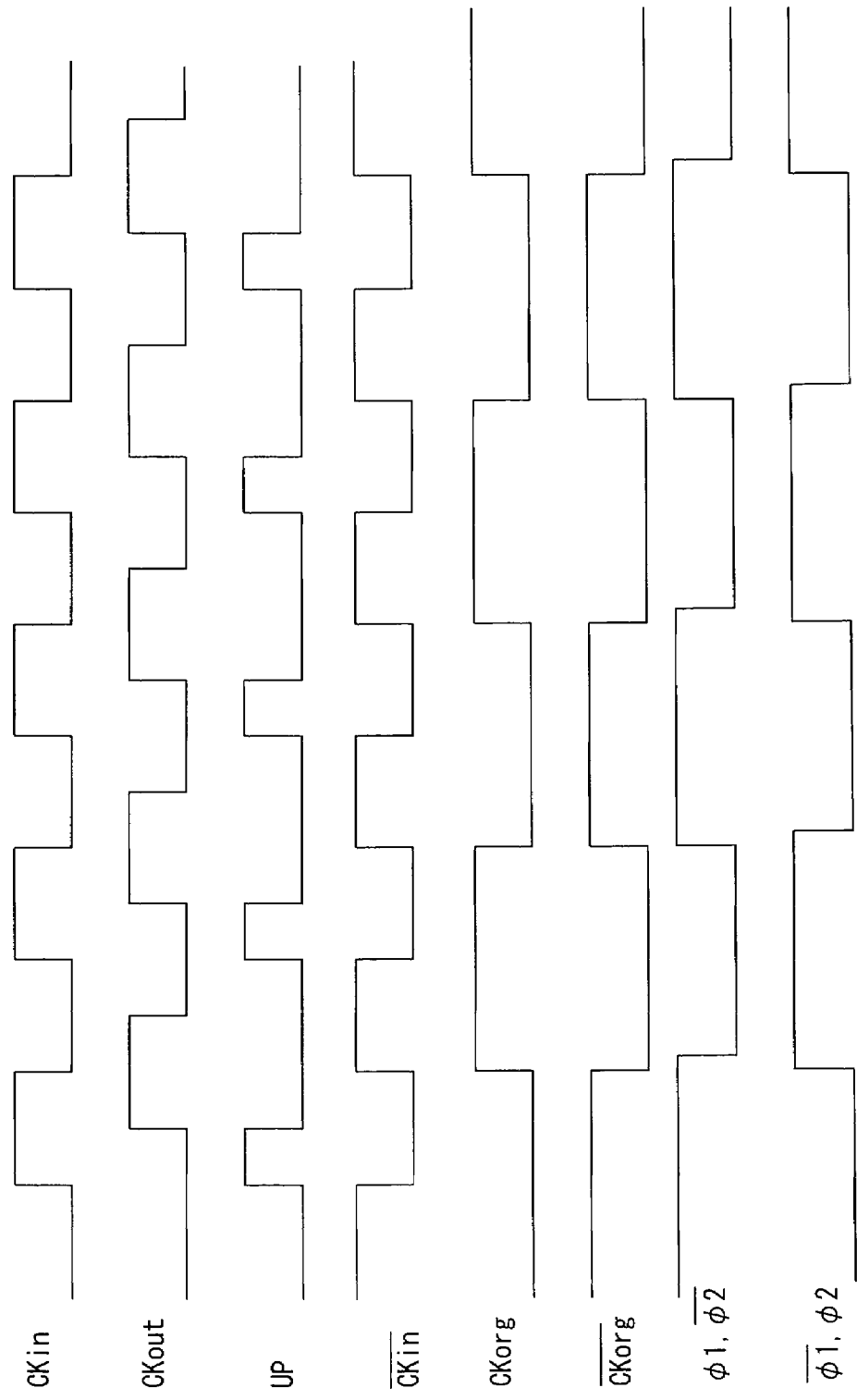
FIG. 3 is a timing chart for the control clock generator circuit of FIG. 2.

The control clock generator circuit 60 generates, on the basis of the input clock CKin, control clocks $\phi1$, $/\phi1$, $\phi2$ and $/\phi2$ and outputs the control clocks to the loop filter 30. FIG. 2 is a block diagram illustrating a configuration of the control clock generator circuit 60. Moreover, FIG. 3 is a timing chart for the control clock generator circuit 60. An inverter 61 inverts the input clock CKin and outputs a clock /CKin. A D flipflop 62 outputs a clock CKorg which synchronizes with a rising of the clock /CKin and of which a polarity is inverted and a clock /CKorg which is inversion of the clock CKorg. A circuit section including an inverter 631 and NAND gates 641 and 651 generates a control clock $\phi1$ and a control clock $/\phi1$ which is inversion of the control clock $\phi1$, on the basis of the clock /CKorg. A circuit section including an inverter 632 and NAND gates 642 and 652 generates a control clock $\phi2$ and a control clock $/\phi2$ which is inversion of the control clock $\phi2$, on the basis of the clock CKorg. That is, the control clock generator circuit 60 outputs control clocks $\phi1$, $/\phi1$, $\phi2$ and $/\phi2$ of which respective polarities are inverted according to a falling of the input clock CKin.

Figure 4:
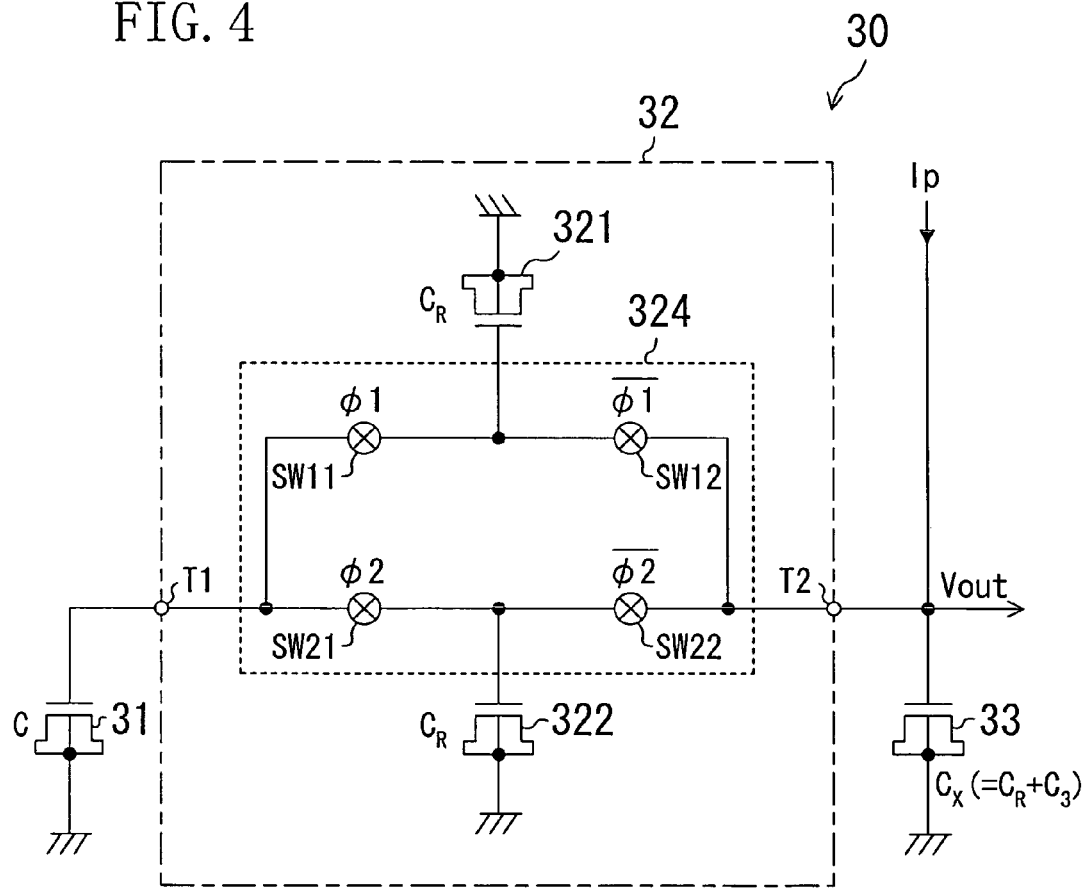
FIG. 4 is a block diagram illustrating a configuration of a loop filter in the phase-locked loop of FIG. 1.

The loop filter 30 receives the charge current Ip, smoothes a voltage generated due to the charge current Ip and outputs the generated voltage as a voltage Vout. FIG. 4 illustrates a circuit configuration of the loop filter 30. The loop filter 30 includes a MOS capacitor 31, a switched capacitor circuit 32 and an MOS capacitor 33. One end of the MOS capacitor 31 is connected to a ground as a reference voltage and the other end of the MOS capacitor 31 is connected to a terminal T1 of the switched capacitor circuit 32. One end of the MOS capacitor 33 is connected to the ground as a reference voltage and the other end of the MOS capacitor 33 is connected to an input terminal for the charge current Ip and a terminal T2 of the switched capacitor circuit 32. The loop filter 30 outputs a voltage Vout generated in a connection point of the switched capacitor circuit 32 and the MOS capacitor 33.

The switched capacitor circuit 32 is a so-called P. S. (parasitic sensitive) type which includes MOS capacitors 321 and 322 and a switching section 324 for switching connection states of the MOS capacitors 321 and the MOS capacitor 322 with the terminals T1 and T2. The switching section 324 includes a switch SW11 for switching a connection state between the MOS capacitor 321 and the terminal T1 according to the control clock $\phi1$, a switch SW12 for switching a connection state between the MOS capacitor 321 and the terminal T2 according to the control clock $/\phi1$, a switch SW21 for switching a connection state between the MOS capacitor 322 and the terminal T1 according to the control clock $\phi2$ and a switch SW22 for switching a connection state between the MOS capacitor 322 and the terminal T2 according to the control clock $/\phi2$. Note that the control clocks $\phi1$, $/\phi1$, $\phi2$ and $/\phi2$ are supplied from the control clock generator circuit 60.

Figure 16:
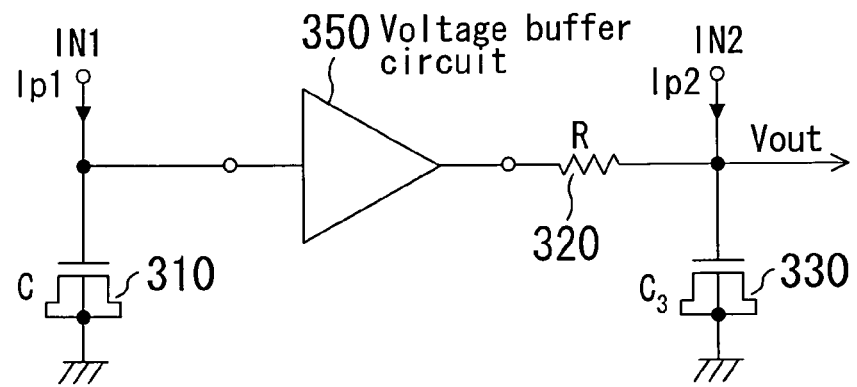
FIG. 16 is a block diagram illustrating a configuration of a loop filter according to the prior application by the first inventor of the present invention et al.
Figure 17:
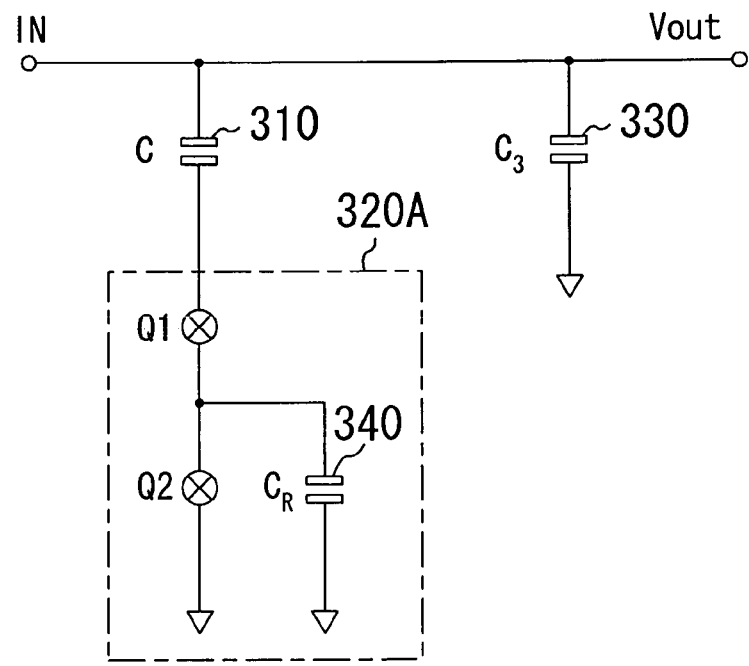
FIG. 17 is a block diagram illustrating a configuration of a known loop filter including a switched capacitor circuit.

A capacitance value of the MOS capacitor 31 is C. The capacitance value C is equivalent to the capacitance value of the capacitor 310 in the loop filter of the prior application (see FIG. 16). Each of respective capacitance values of the MOS capacitors 321 and 322 is $C_R$. A resistance value exhibited by the switched capacitor circuit 32 is R. The resistance R is equivalent to the resistance value of the resistor 320 in the loop filter of the prior application. Assume that an operation frequency of each of the switches SW11, SW12, SW21 and SW22 in the switched capacitor circuit 32 is $f_{clk}$. The equation of $R=1/(f_{clk}C_R)$ holds. That is, to increase the resistance value of the switched capacitor circuit 32, the respective capacitances of the MOS capacitors 321 and 322 are reduced. As has been described, when the charge current Ip supplied to the loop filter 30 is intended to be reduced, the resistance value of the switched capacitor circuit 32 has to be increased. Then, when the resistance of the switched capacitor circuit 32 is intended to be increased, the respective capacitances of the MOS capacitors 321 and 322 are reduced. That is, reduction in circuit size of each of the MOS capacitors 321 and 322 is achieved by reducing the charge current Ip. Also, with the charge current Ip reduced, the size of each of the MOS capacitors 31 and 33 is reduced. As a result, the circuit size of the entire loop filter 30 is reduced.

A capacitance value of the MOS capacitor 33 is $C_X$. The capacitance value $C_X$ corresponds to a total of the capacitance value $C_R$ of each of the MOS capacitors 321 and 322 and a capacitance value $C_3$ of the capacitor 330 in the loop filter of the prior application. When the capacitance value $C_3$ is about ⅕-⅙ of a capacitance value C of the MOS capacitor 31 at largest, the most stable response can be obtained. Details about this is described, for example, in Reference: F. M. GARDNER, "CHARGE-PUMP PHASE-LOCKED-LOOPS", IEEE TRANS., VOL. COM-28, PP. 1849-1858, November 1980.

When a phase of the input clock CKin precedes a phase of the output clock CKout, one of output signals of the phase comparator 10 in the PLL of FIG. 1, for example, a signal UP becomes a predetermined logic level, ex., "H" (see FIG. 3) in a period from a rising of the input clock CKin to a rising of the output clock CKout. While the signal UP is "H", the charge current Ip is output from the charge pump circuit 20 to the loop filter 30. While the charge current Ip is received, an operation state of the switching section 324 must not be changed. If the operation state of the switching section 324 is changed, there might be cases where discharge/charge of charges to the MOS capacitors 321 and 322 in the switched capacitor circuit 32 is interrupted and the loop filter 30 is not normally operated. As for the control clocks $\phi1$, $/\phi1$, $\phi2$ and $/\phi2$ generated by the control clock generator circuit 60 of this embodiment, their polarities are not inverted in a period from a falling of the input clock CKin to a next falling thereof. Therefore, discharge and charge of charges to the MOS capacitors 321 and 322 are not interrupted. In any case, outputting of each of the signals UP and DN is completed during continuous falling of the input clock CKin. Accordingly, by controlling the operation of the switched capacitor circuit 32, on the basis of each control clock generated by the control clock generator circuit 60, a normal operation of the loop filter 30 is ensured.

Figure 5:
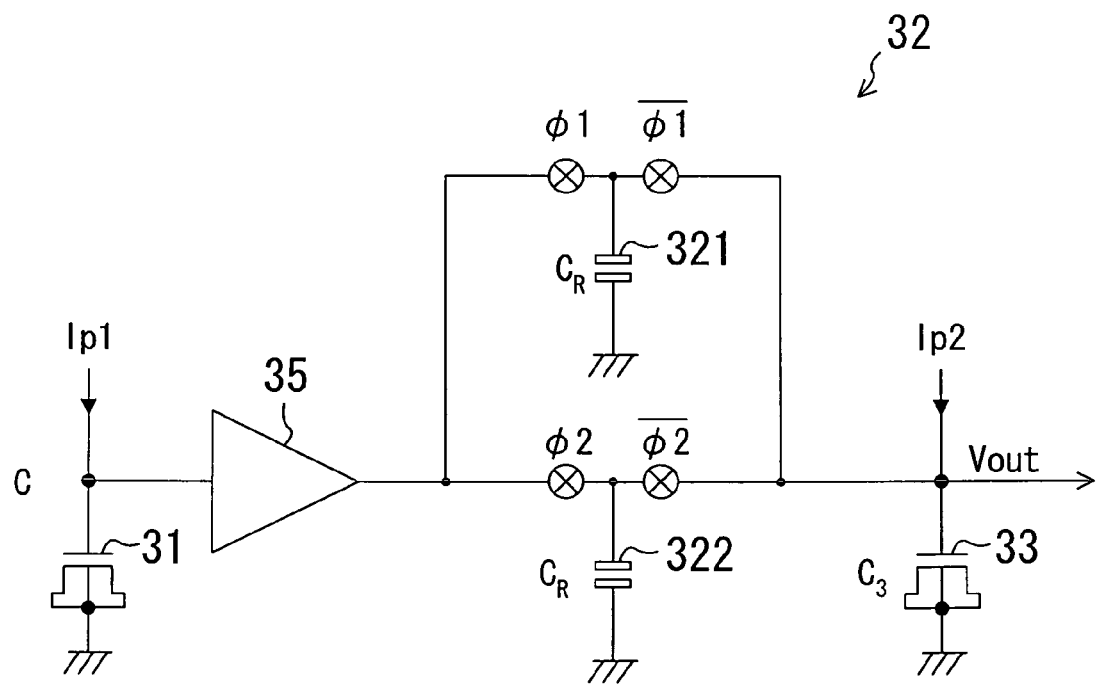
FIG. 5 is a block diagram illustrating a configuration of a loop filter obtained by merely replacing a resistor in a loop filter according to the prior application with a switched capacitor circuit.

Next, the loop filter 30 having the same filter characteristics as those of a general active-type secondary loop filter will be explained while describing what modification is made to the circuit configuration of the loop filter of the prior application to obtain the loop filter 30. FIG. 5 is a block diagram illustrating a configuration of a loop filter obtained by merely replacing the resistor in the loop filter of the prior application with a switched capacitor circuit. The loop filter obtained by merely replacing the resistor in the loop filter of the prior application with the two-phase clock controlled switched capacitor circuit 32 is not normally operated. The reason for this is as follows. After discharge/charge by the charge current Ip for one of the MOS capacitors 321 and 322 connected to an input side of a charge current Ip2 has been completed, respective polarities of the control clocks φ1 and φ2 are inverted and the MOS capacitor is connected to a voltage buffer circuit 35 side. When the connection is provided, the MOS capacitor is reset to be a potential of an output terminal of the voltage buffer circuit 35. As a result, the switched capacitor circuit 32 might not be normally operated and misoperation of the loop filter 30 might be caused. Note that the following description will be made on the assumption that the charge currents Ip1 and Ip2 are the same in current size.

Figure 6:
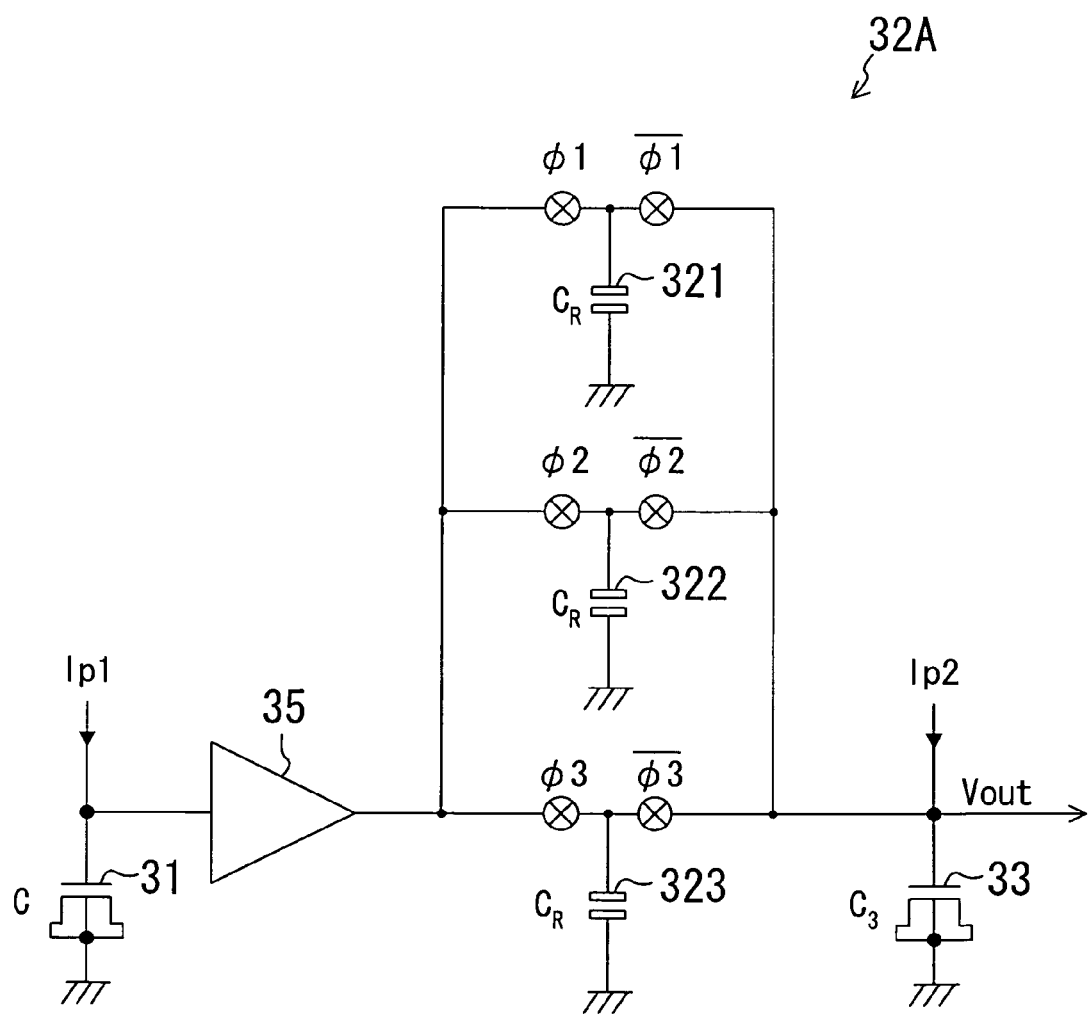
FIG. 6 is a block diagram illustrating a configuration of a loop filter obtained by changing the switched capacitor circuit in the loop filter of FIG. 5 to a three-phase clock controlled switched capacitor circuit.

To solve the above-described problems, charges discharge/charged by the charge current Ip have to be maintained in a period corresponding to at least one clock cycle of the control clock φ1 or φ2. Therefore, use of a three-phase clock controlled switch capacitor circuit will be considered. FIG. 6 is a block diagram illustrating a configuration of a loop filter obtained by changing the switched capacitor circuit in the loop filter of FIG. 5 to a three-phase clock controlled switched capacitor circuit. In the switched capacitor circuit 32A, a connection state between one of the capacitors 321, 322 and 323 connected to the MOS capacitor 33 and the MOS capacitor 33 is maintained, even when respective connection states of the other two are switched to different states. Thus, the capacitor is not reset to a buffer potential, so that a normal operation of the switched capacitor circuit 32A is ensured. The loop filter will be later described in detail.

Figure 7:
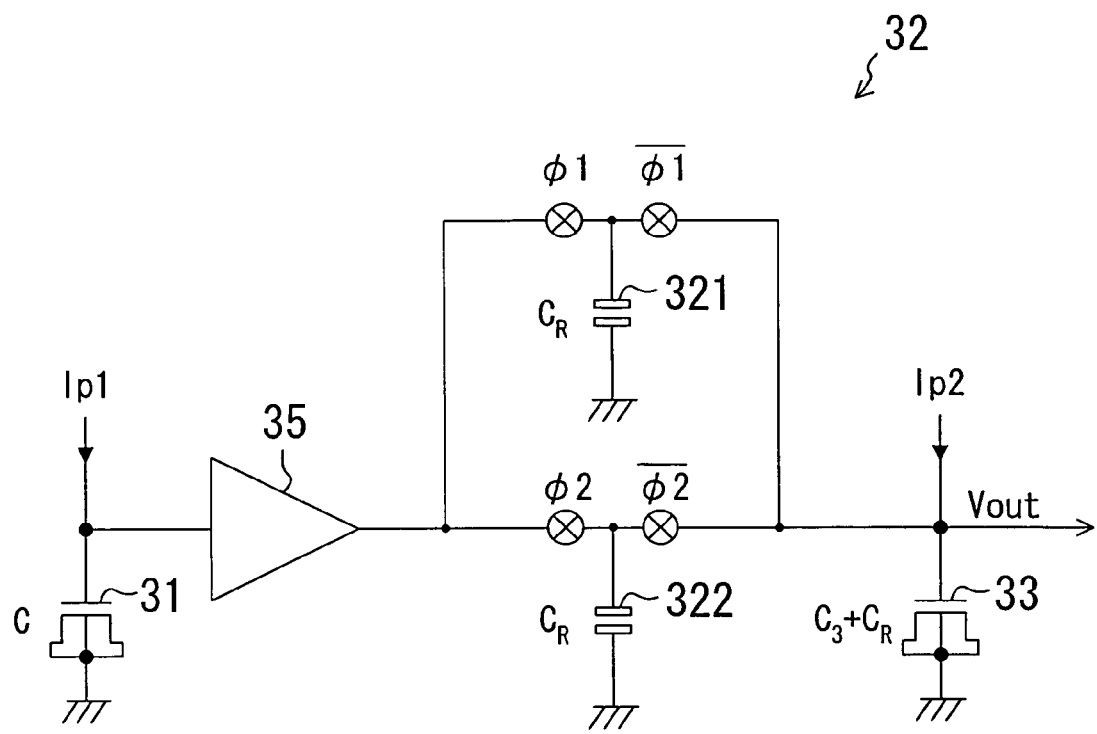
FIG. 7 is a block diagram illustrating a configuration of a loop filter obtained by changing the switched capacitor circuit in the loop filter of FIG. 6 to a two-phase clock controlled switched capacitor circuit.

In the switched capacitor circuit 32A, when connection states of two of the capacitors 321, 322 and 323 are switched, connection between the other one of the capacitors 321, 322 and 323 and the MOS capacitor 33 is maintained. This is like a state where the MOS capacitor 33 and a capacitor having a capacitance value $C_R$ are constantly connected to each other in parallel. Therefore, by increasing the capacitance value of the MOS capacitor 33 by the capacitance value $C_R$ of each of the capacitors 321, 322 and 323 in the switched capacitor circuit 32A, a two-phase clock controlled switched capacitor circuit can be used, instead of the three-phase clock controlled switched capacitor circuit 32A. That is, replacement with the switched capacitor circuit 32 of FIG. 5 can be achieved. FIG. 7 is a block diagram illustrating a configuration of a loop filter obtained by changing the switched capacitor circuit in the loop filter of FIG. 6 to a two-phase clock controlled switched capacitor circuit. The loop filter of FIG. 7 is different from the loop filter of FIG. 5 in that in contrast to a capacitance value of the MOS capacitor 33 is $C_3$ in the loop filter of FIG. 5, a capacitance value of the MOS capacitor 33 in FIG. 7 is $C_3+C_R$.

Figure 8:
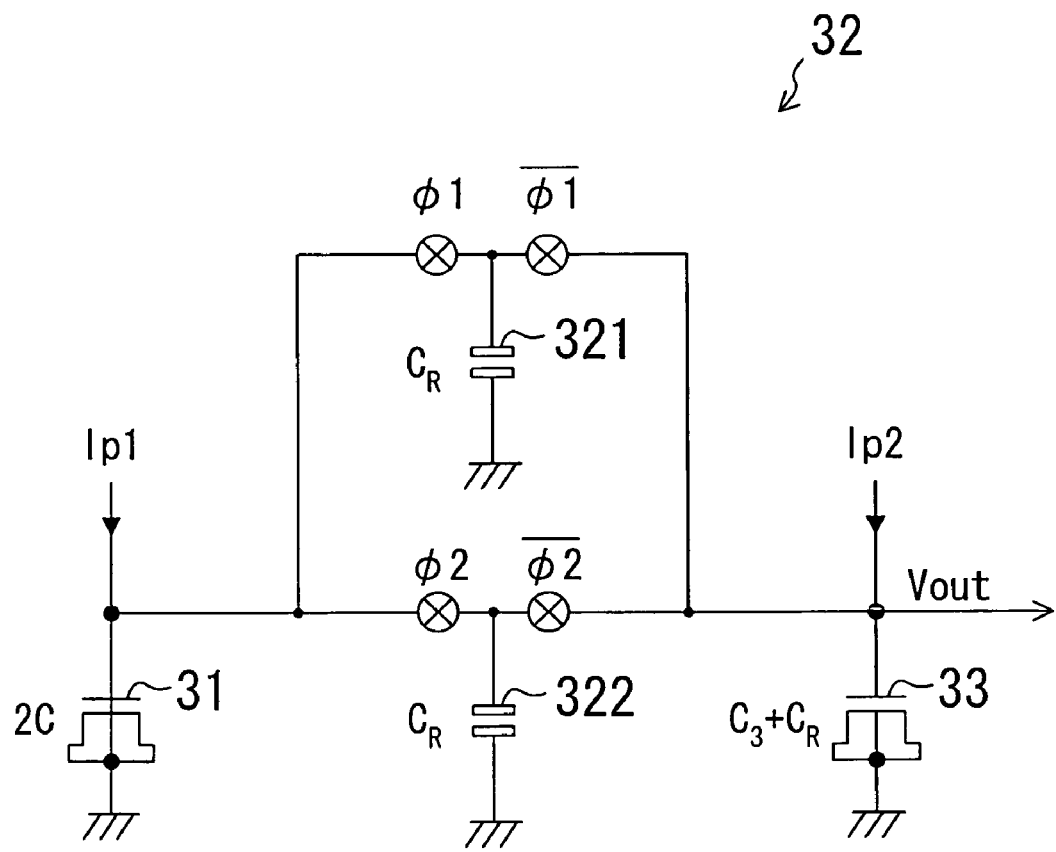
FIG. 8 is a block diagram illustrating a configuration of a loop filter obtained by omitting a voltage buffer circuit in the loop filter of FIG. 7.

In general, a voltage buffer circuit is connected to a power supply source and thus there might be cases where noise is transmitted to a loop filter via the power supply source. The voltage buffer circuit itself consumes electric power. Therefore, it is preferable to omit the voltage buffer circuit 35. Then, removal of the voltage buffer circuit 35 from the loop filter of FIG. 7 will be considered. FIG. 8 is a block diagram illustrating a configuration of a loop filter obtained by omitting a voltage buffer circuit in the loop filter of FIG. 7. When the voltage buffer circuit 35 is removed from the loop filter of FIG. 7, the MOS capacitor 31 is discharged/charged by a resultant value of the charge currents Ip1 and Ip2. Thus, a speed of discharge/charge becomes doubled. Therefore, the capacitance value of the MOS capacitor 31 is made to be doubled, i.e., 2C so that an equivalent discharge/charge speed to that in the case where the voltage buffer circuit 35 is provided is achieved.

Figure 9:
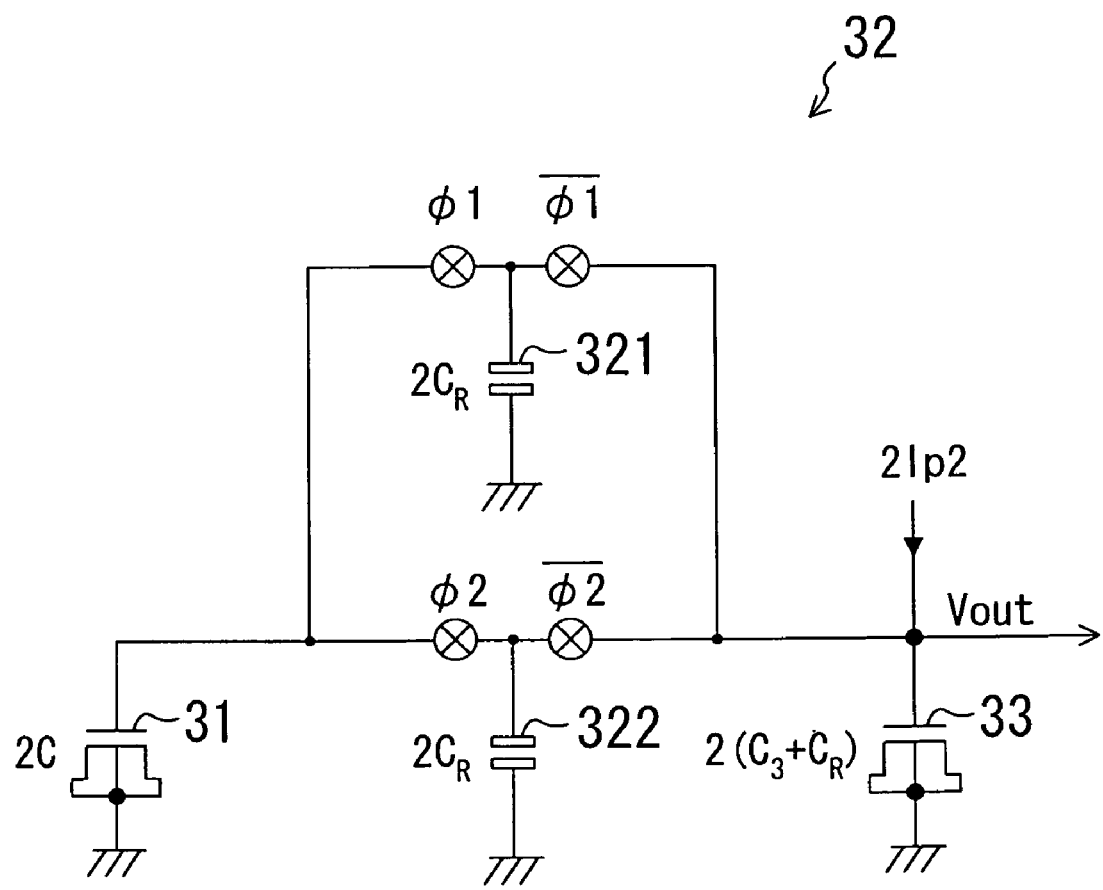
FIG. 9 is a block diagram illustrating a configuration of a loop filter obtained by changing the loop filter of FIG. 8 to a single charge current input.

Furthermore, providing a single charge current input in the loop filter of FIG. 8 will be considered. FIG. 9 is a block diagram illustrating a configuration of a loop filter obtained by changing the loop filter of FIG. 8 to a single charge current input. In the loop filter of FIG. 8, the MOS capacitor 31 is discharged/charged by a resultant value of the charge currents Ip1 and Ip2. Thus, to achieve a single charge current input, a current value of the charge current is made to be a current value (2Ip2 corresponding to the double of the charge current Ip2 in this case) corresponding to the resultant value of the charge currents Ip1 and Ip2. Accordingly, each of respective capacitance values of the capacitors 321 and 322 and a capacitance value of the MOS capacitor 33 in the switched capacitor circuit 32 is made to be doubled.

The loop filter of FIG. 9 has a circuit configuration obtained by doubling a capacitance value and a charge current value of each capacitor in the loop filter 30 of this embodiment shown in FIG. 4. That is, the loop filter of FIG. 9 has substantially the same circuit configuration as that of the loop filter 30 and has the same filter characteristics as those of a general active-type secondary loop filter.

As has been described, according to this embodiment, a loop filter can be formed not to include a resistor and a voltage buffer circuit but include only MOS capacitors. Thus, a circuit size can be reduced while noise and power consumption are reduced. Moreover, with the charge current Ip set to be relatively small, a circuit size of the charge pump circuit 20 can be reduced. As a result, a circuit size of the entire PLL can be largely reduced.

Figure 10:
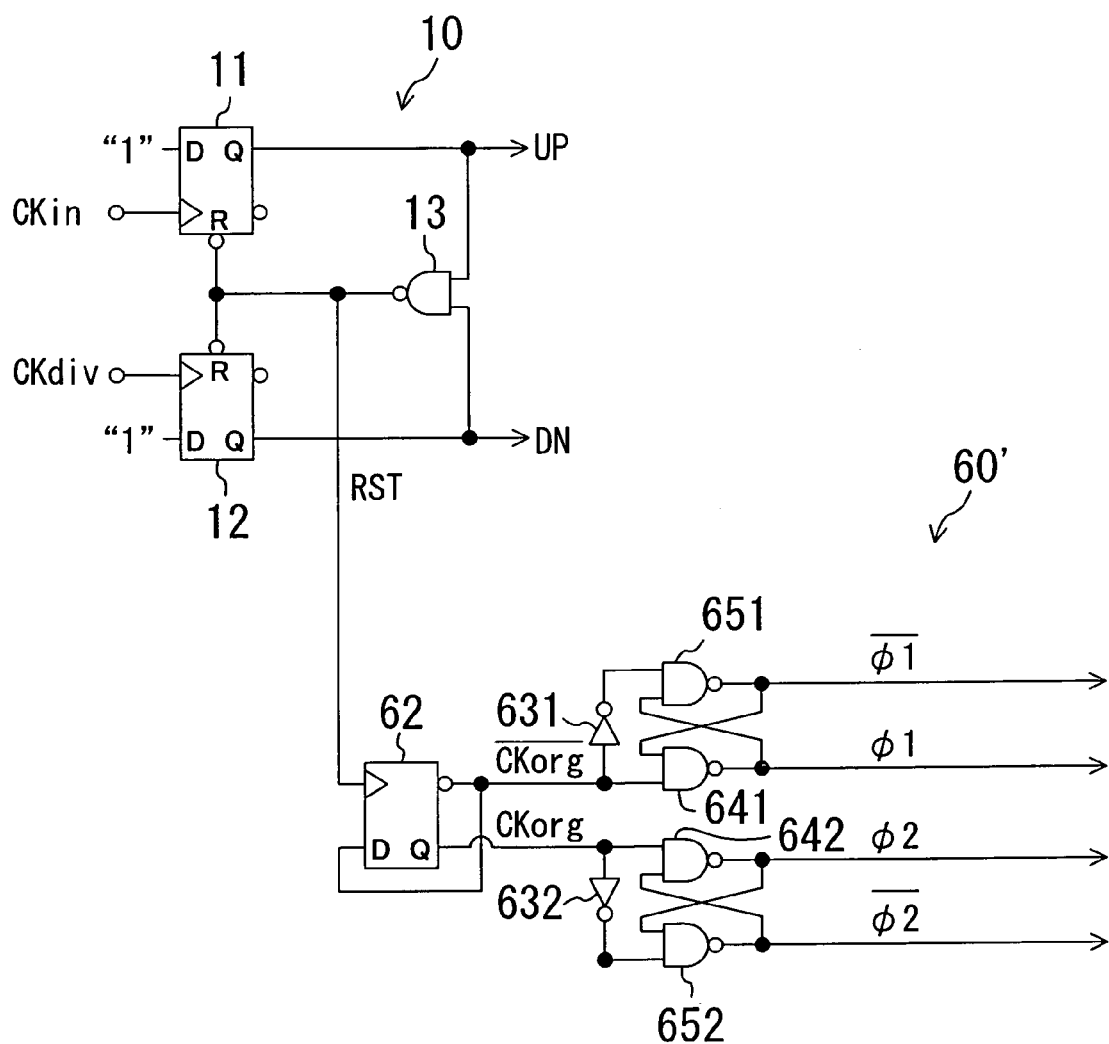
FIG. 10 is a block diagram illustrating a configuration of a control clock generator circuit for generating each control clock, on the basis of a reset pulse from a phase comparator.
Figure 11:
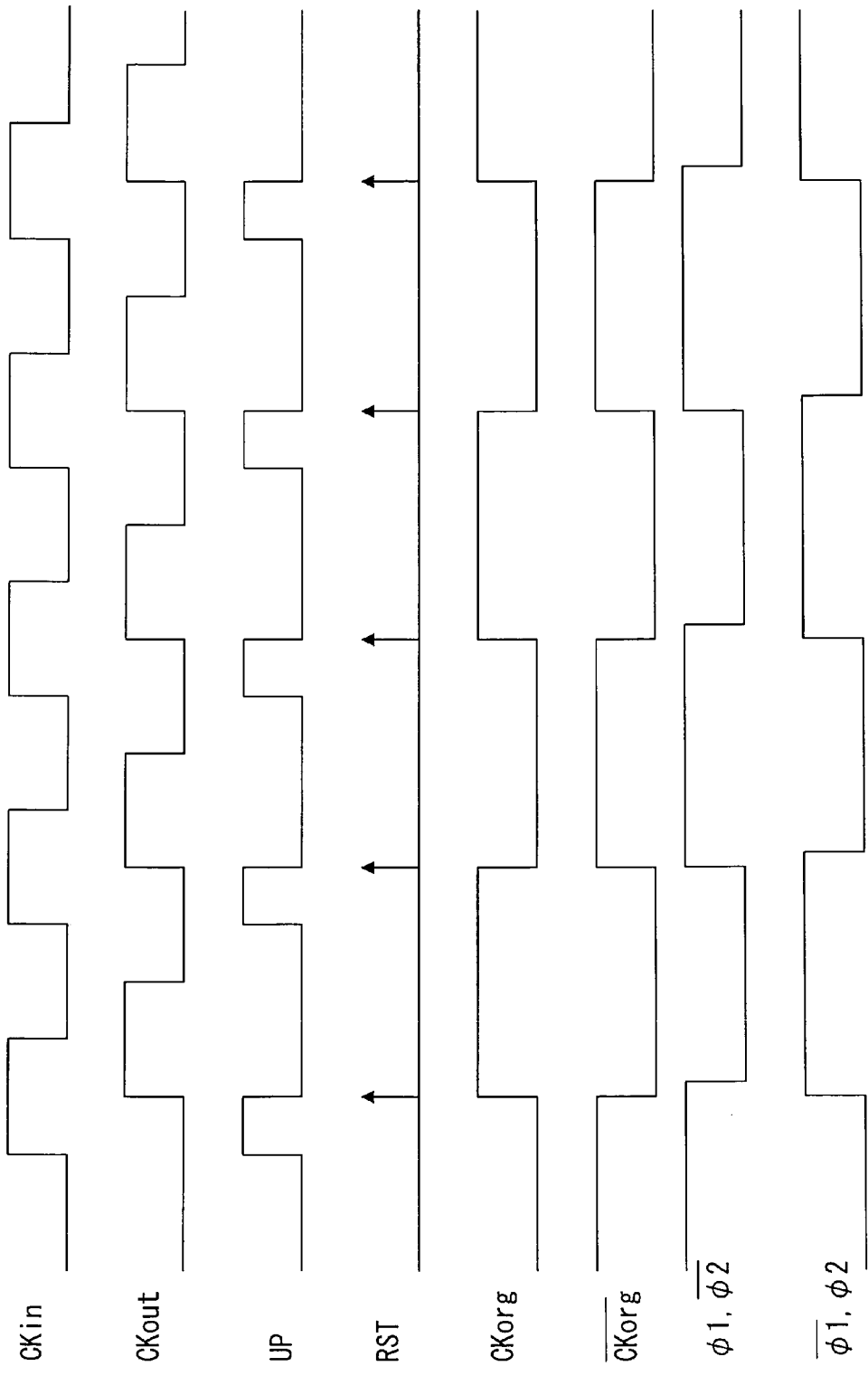
FIG. 11 is a timing chart for the control clock generator circuit of FIG. 10.

Note that the control clocks φ1, /φ1, φ2 and /φ2 may be generated on the basis of a reset pulse in the phase comparator 10. FIG. 10 is a block diagram illustrating a configuration of a control clock generator circuit 60' for generating each control clock, on the basis of a reset pulse RST from the phase comparator 10. FIG. 11 is a timing chart for the control clock generator circuit 60'. The reset pulse RST is output from a NAND gate 13 in the phase comparator 10 including D flip-flops 11 and 12 and the NAND gate 13. That is, the reset pulse RST is a pulse with a very short duty and is output after the signal UP or DN is output. The control clock generator circuit 60' receives a reset pulse RST, instead of an inversion of the input clock CKin, generates, on the basis of the reset pulse RST, the control clocks φ1, /φ1, φ2 and /φ2 and then outputs the control clocks φ1, /φ1, φ2 and /φ2. As described above, the reset pulse RST is a pulse to be output after outputting the signal UP or DN, and thus the polarity of each of the control clocks is not inverted while the signal UP or DN is output.

However, a pulse width of the reset pulse RST is very small and therefore there might be cases where the D flipflop 62 does not respond to an input of the reset pulse RST. In such a case, the switched capacitor circuit 32 in the loop filter 30 is not normally operated. Therefore, it is more preferable to use the control clock generator circuit 60 than to use the control clock generator circuit 60'.

Second Embodiment

Figure 12:
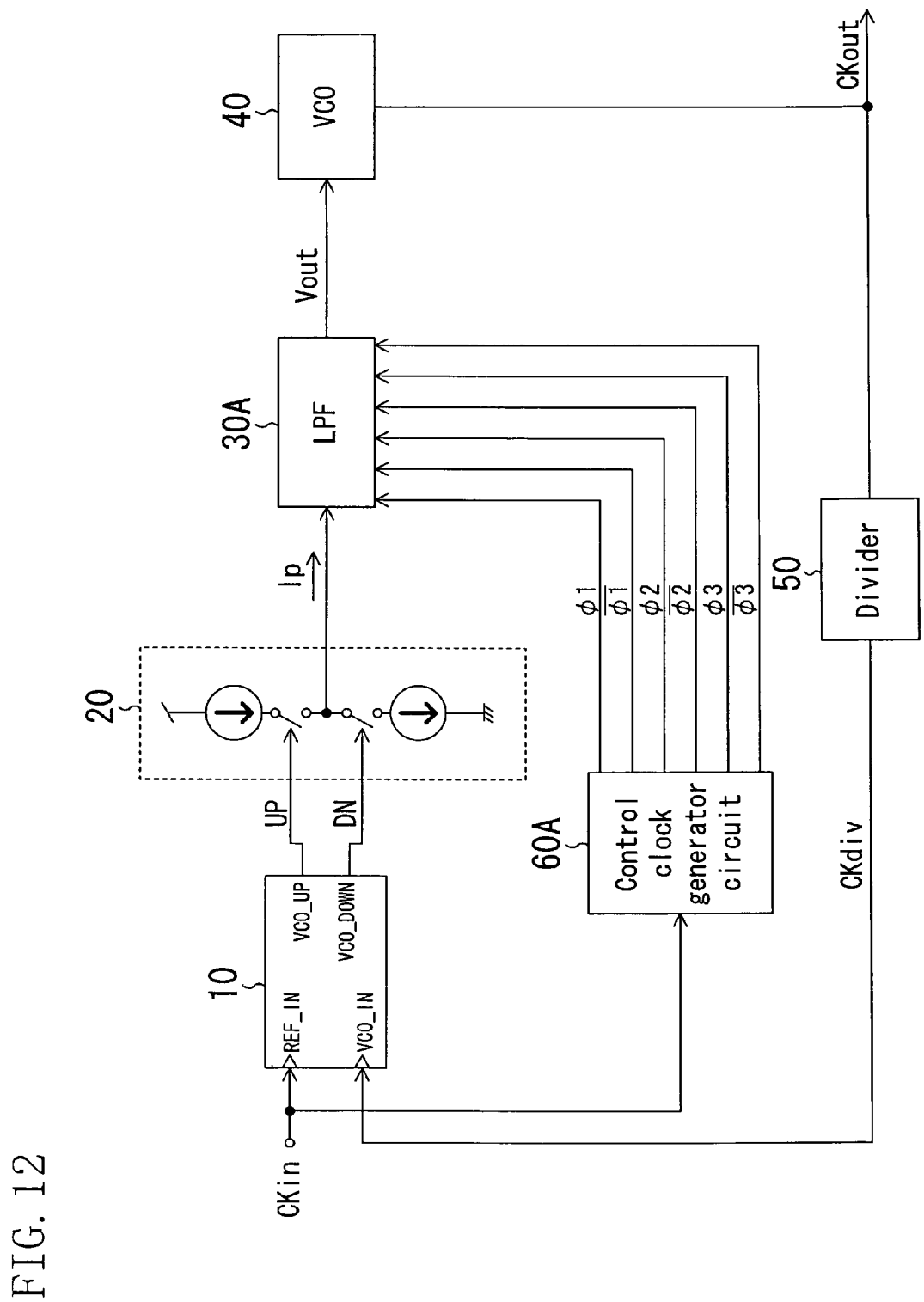
FIG. 12 is a block diagram illustrating a configuration of a phase-locked loop according to a second embodiment of the present invention.

FIG. 12 is a block diagram illustrating a configuration of a PLL according to a second embodiment of the present invention. The PLL of this embodiment includes a phase comparator 10, a charge pump circuit 20, a loop filter 30A, a voltage control oscillator 40, a frequency divider 50 and a control clock generator circuit 60A. Of these components, the phase comparator 10, the charge pump circuit 20, the voltage control oscillator 40 and the frequency divider 50 are the same as those described in the first embodiment and therefore the description thereof will be omitted. Hereafter, configurations and operations of the loop filter 30A and the control clock generator circuit 60A will be described in detail.

Figure 13:
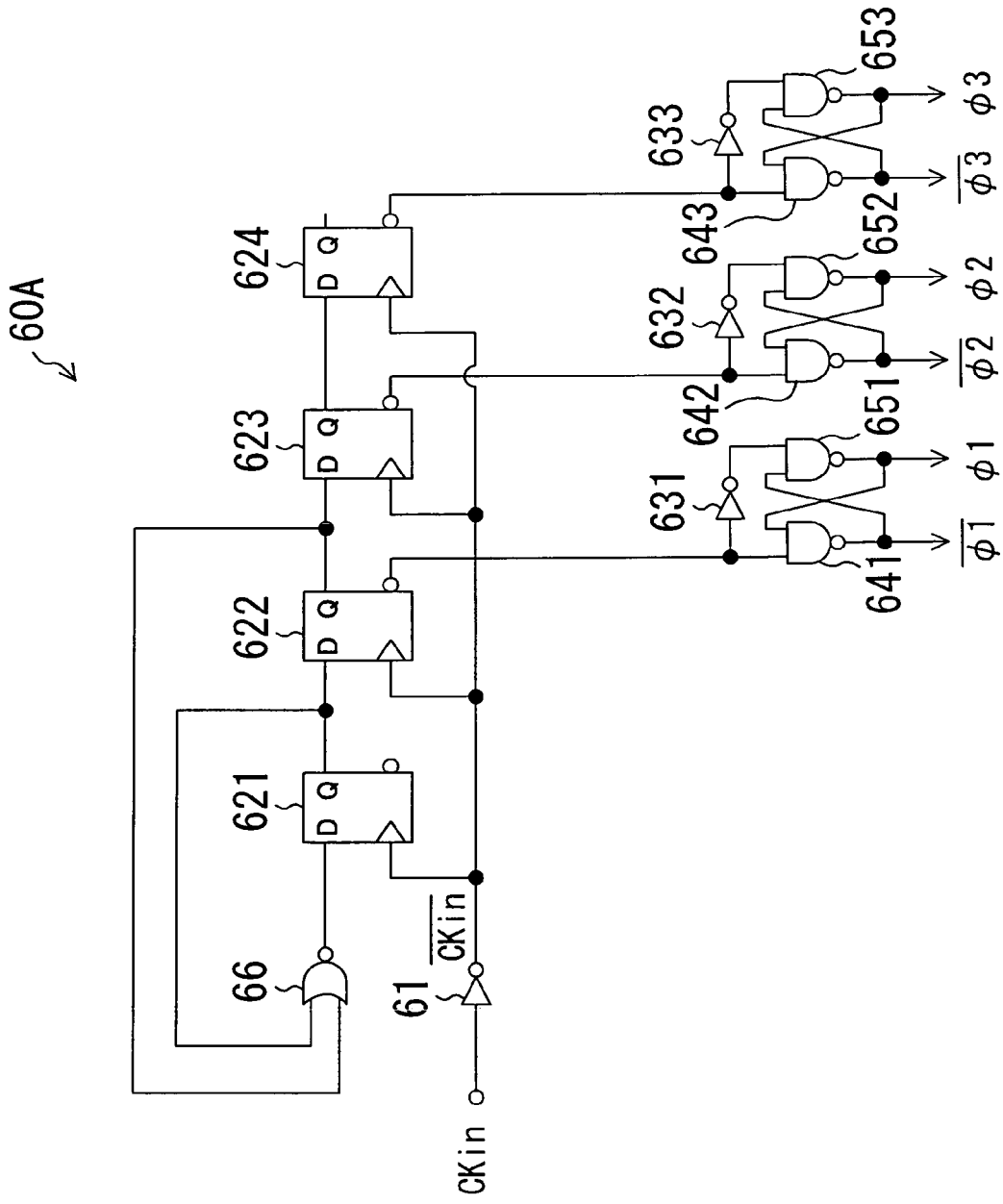
FIG. 13 is a block diagram illustrating a configuration of a control clock generator circuit in the phase-locked loop of FIG. 12.
Figure 14:
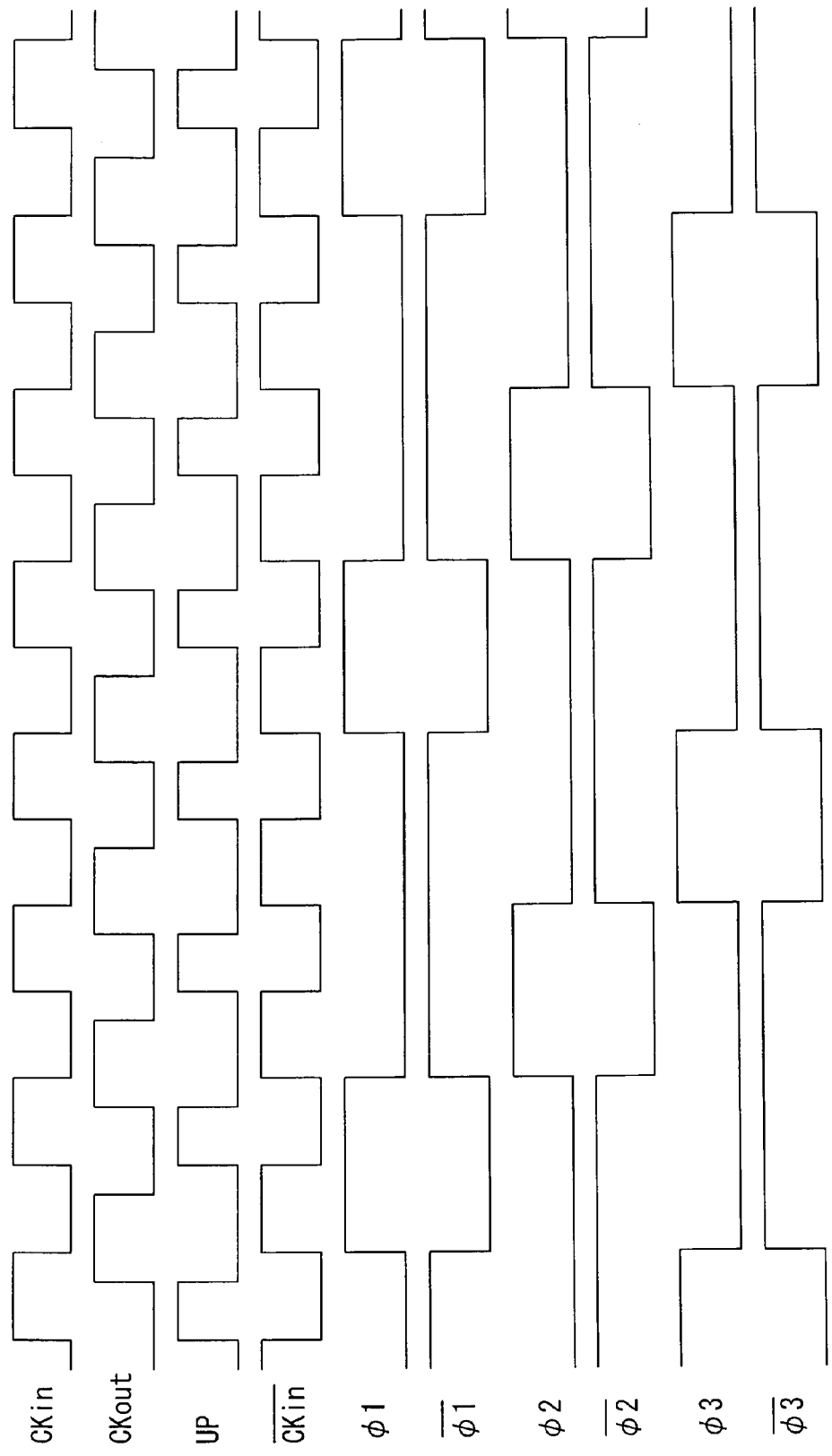
FIG. 14 is a timing chart for the control clock generator circuit of FIG. 13.

The control clock generator circuit 60A generates control clocks $\phi 1$, /$\phi 1$, $\phi 2$, /$\phi 2$, $\phi 3$ and /$\phi 3$, on the basis of an input clock CKin, and outputs these control clocks to the loop filter 30A. FIG. 13 is a block diagram illustrating a configuration of the control clock generator circuit 60A. FIG. 14 is a timing chart for the control clock generator circuit 60A. An inverter 61 inverts the input clock CKin and output a clock /CKin. D flipflops 621, 622, 623 and 624 are synchronized with a rising of the clock /CKin and are operated. An output of each of the D flipflops 621 and 622 is an input of a NOR gate 66. An output of the NOR gate 66 is a data input of the D flipflop 621. A circuit section including the inverter 631 and NAND gates 641 and 651 generates a control clock $\phi 1$ and a control clock (inversion control clock) /$\phi 1$ which is inversion of the control clock $\phi 1$, on the basis of an inversion output from the D flipflop 622. A circuit section including an inverter 632 and NAND gates 642 and 652 generates the control lock $\phi 2$ and a control clock (inversion control clock) /$\phi 2$ which is inversion of the control clock $\phi 2$, on the basis of an inversion output from the D flipflop 623. Then, a circuit section including an inverter 633 and NAND gates 643 and 653 generates a control clock $\phi 3$ and a control clock (inversion control clock) /$\phi 3$ which is inversion of the control clock $\phi 3$, on the basis of an inversion output from the D flipflop 624. The control clocks $\phi 1$, $\phi 2$ and $\phi 3$ output from the control clock generator circuit 60A having the above-described configuration are different from one another. That is, the control clock generator circuit 60A generates different control clocks of three different phases, on the basis of the input clock CKin.

Figure 15:
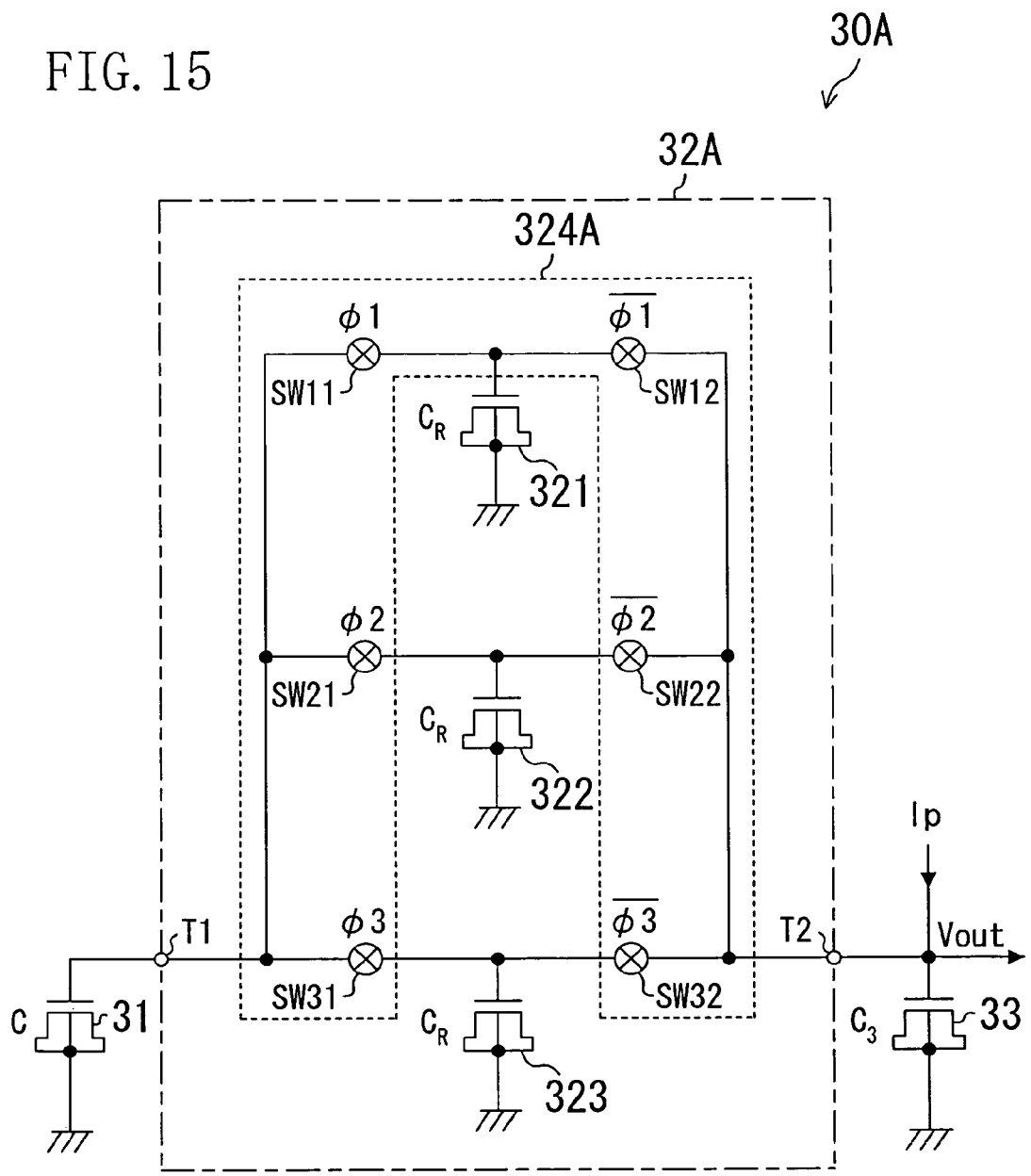
FIG. 15 is a block diagram illustrating a configuration of a loop filter in the phase-locked loop of FIG. 12.

FIG. 15 is a block diagram illustrating a configuration of the loop filter 30A. The loop filter 30A is obtained by omitting the voltage buffer circuit 35 from the loop filter of FIG. 6 and changing the charge current input to a signal charge current input.

The switched capacitor circuit 32A includes MOS capacitors 321, 322 and 323 and a switching section 324A for switching connection states of the MOS capacitors 321, 322 and 323 with terminals T1 and T2. The switching section 324A includes a switch SW1 for switching a connection state between the MOS capacitor 321 and the terminal T1 according to the control clock $\phi 1$, a switch SW12 for switching a connection state between the MOS capacitor 321 and the terminal T2 according to the control clock /$\phi 1$, a switch SW21 for switching a connection state between the MOS capacitor 322 and the terminal T1 according to the control clock $\phi 2$, a switch SW22 for switching a connection state between the MOS capacitor 322 and the terminal T2 according to the control clock /$\phi 2$, a switch SW31 for switching a connection state between the MOS capacitor 323 and the terminal T1 according to the control clock $\phi 3$ and a switch SW32 for switching a connection state between the MOS capacitor 323 and the terminal T2 according to the control clock /$\phi 3$.

When connection directions of two of the MOS capacitors 321 through 323 in the switched capacitor circuit 32A are switched, the other of the MOS capacitors 321 through 323 is kept connected with the MOS capacitor 33. For example, when a polarity of each of the control clocks $\phi 1$, /$\phi 1$, $\phi 2$ and /$\phi 2$ is inverted, a logic level of the control clock /$\phi 3$ is kept to be "H" (see FIG. 14). That is, when connection directions of the MOS capacitors 321 and 322 are changed, the MOS capacitor 323 is continuously connected to the MOS capacitor 33 in parallel. Accordingly, charge discharged/charged from/to the MOS capacitor 323 is not reset, so that a normal operation of the switched capacitor circuit 32A is ensured.

As has been described, according to this embodiment, the loop filter including only MOS capacitors without using a resistor and a voltage buffer circuit. Thus, a circuit size is reduced while noise and power consumption are reduced. Moreover, with the charge current Ip set to be relatively small, a circuit size of the charge pump circuit 20 can be reduced. As a result, a circuit size of the entire PLL can be largely reduced.

Note that, instead of the switched capacitor circuit 32A, a four- or more-clock controlled switched capacitor circuit may be provided. In such a case, respective connection states of the MOS capacitors are controlled so that connection between one of the MOS capacitors and the MOS capacitor 33 is maintained and respective connection directions of the other ones of the MOS capacitors in the switched capacitor circuit are switched.

In each of PLL of FIG. 1 and PLL of FIG. 12, instead of the voltage control oscillator 40, a voltage control delay circuit (VCD) as an output clock generator circuit is provided, the frequency divider 50 is omitted and the output clock CKout output by the control delay circuit is directly fed back to the phase comparator 10. Thus, a delay locked loop (DLL) is constituted.

INDUSTRIAL APPLICABILITY

A switched capacitor filter according to the present invention has the same filter characteristics as those of a known filter and has a reduced circuit size. Thus, in microprocessor including many PLLs, the switched capacitor filter is useful as a loop filter in each of the PLLs. Also, in a semiconductor integrated circuit of which a circuit size is limited, for example, an IC card on which a large capacitor is difficult to mount, the switched capacitor filter of the present invention is useful as a loop filter of each PLL.

The invention claimed is:
1. A switched capacitor filter for receiving a current signal and outputting a voltage signal, the switched capacitor filter comprising:
   a first capacitor provided between an input terminal for the current signal and a reference voltage;
   a switched capacitor circuit provided between the input terminal and the first capacitor; and
   a second capacitor provided in parallel to the first capacitor and the switched capacitor circuit;
   wherein the switched capacitor circuit includes:
   a first terminal provided on a side of the first capacitor,
   a second terminal provided on a side of the input terminal, a plurality of at least three capacitors each having one end to which a reference voltage is supplied and substantially the same capacitance, and a switching section for switching a connection state between the other end of each of the plurality of at least three capacitors and an associated one of the first and second terminals, wherein, while maintaining connection between the other end of one of the plurality of at least three capacitors and the second terminal, when the switching section connects the other end of one of other two of the plurality of at least three capacitors to the first terminal, the switching section connects the other end of the other one of the other two to the second terminal.

2. The switched capacitor filter of claim 1, wherein each of the first and second capacitors and the plurality of at least three capacitors is a MOS capacitor.

3. A feedback system for feeding back an output clock generated on the basis of an input clock to make the output clock have a predetermined characteristic, the feedback system comprising:

a charge pump circuit for generating a charge current, on the basis of a phase difference between the input clock and a fed-back clock;

a loop filter for receiving the charge current as an input; and an output clock generator circuit for generating the output clock, on the basis of an output signal from the loop filter, wherein the loop filter includes:

a first capacitor provided between an input terminal for the charge current and a reference voltage;

a switched capacitor circuit provided between the input terminal and the first capacitor; and a second capacitor provided in parallel to the first capacitor and the switched capacitor circuit;

wherein the switched capacitor circuit includes:

a first terminal provided on a side of the first capacitor, a second terminal provided on a side of the input terminal, a plurality of at least three capacitors each having one end to which a reference voltage is supplied and substantially the same capacitance, and a switching section for switching a connection state between the other end of each of the plurality of at least three capacitors and an associated one of the first and second terminals, wherein, while maintaining connection between the other end of one of the plurality of at least three capacitors and the second terminal, when the switching section connects the other end of one of the other two of the plurality of at least three capacitors to the first terminal, the switching section connects the other end of the other one of the other two to the second terminal.

4. The feedback system of claim 3, further comprising a control clock generator circuit for generating, on the basis of a falling of the input clock, a plurality of control clocks having different phases from each other and a number of the plurality of control clocks corresponds to a number of the plurality of at least three capacitors and a plurality of inversion control clocks corresponding to inversed clocks of the plurality of control clocks, wherein the switching section includes:

a plurality of switches, provided so as to correspond to the plurality of at least three capacitors, respectively, each switching a connection state between the other end of an associated one of the plurality of at least three capacitors and the first terminal according to one of the plurality of control clocks corresponding to the associated one of the plurality of at least three capacitors, and a plurality of switches, provided so as to correspond to the plurality of at least three capacitors, respectively, each switching a connection state between the other end of an associated one of the plurality of at least three capacitors and the second terminal according to one of the plurality of control clocks corresponding to the associated one of the plurality of at least three capacitors.

5. The feedback system of claim 3, wherein each of the first and second capacitors and the plurality of at least three capacitors is a MOS capacitor.

* * * * *